United States Patent
Johansson

(10) Patent No.: US 11,887,795 B2
(45) Date of Patent: Jan. 30, 2024

(54) CONTACTOR CONTROL

(71) Applicant: ABB Schweiz AG, Baden (CH)

(72) Inventor: Gunnar Johansson, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 18/044,591

(22) PCT Filed: Aug. 6, 2021

(86) PCT No.: PCT/EP2021/072000
§ 371 (c)(1),
(2) Date: Mar. 9, 2023

(87) PCT Pub. No.: WO2022/058089
PCT Pub. Date: Mar. 24, 2022

(65) Prior Publication Data
US 2023/0335359 A1   Oct. 19, 2023

(30) Foreign Application Priority Data
Sep. 16, 2020 (EP) ..................................... 20196398

(51) Int. Cl.
*H01H 47/00* (2006.01)
*H01H 47/22* (2006.01)

(52) U.S. Cl.
CPC .......... *H01H 47/002* (2013.01); *H01H 47/22* (2013.01)

(58) Field of Classification Search
CPC .............................. H01H 47/002; H01H 47/22
USPC ....................................................... 361/115
See application file for complete search history.

(56) References Cited

U.S. PATENT DOCUMENTS

| | | | | |
|---|---|---|---|---|
| 2,942,155 A | * | 6/1960 | Loeffler | H01H 75/04 361/72 |
| 3,192,450 A | * | 6/1965 | Reifel | H01H 47/00 361/186 |
| 3,284,670 A | * | 11/1966 | Fairman | H02H 3/347 310/11 |

(Continued)

FOREIGN PATENT DOCUMENTS

| CN | 105225895 A | 1/2016 |
|---|---|---|
| EP | 0694937 A2 | 1/1996 |

(Continued)

OTHER PUBLICATIONS

International Preliminary Report on Patentability; Application No. PCT/EP2021/072000; dated Dec. 16, 2022; 17 Pages.

(Continued)

*Primary Examiner* — Dharti H Patel
(74) *Attorney, Agent, or Firm* — Whitmyer IP Group LLC

(57) ABSTRACT

A method of controlling a mechanical contactor including at least one pair of contacts for conducting a mains current (Im) when the contactor is in a closed position, and an electromagnet arranged to close the contactor, and maintain the contactor in the closed position, by forcing the pair of contacts towards each other when a control current (Ic) runs through a coil of the electromagnet. The method includes, while the contactor is in the closed position, obtaining an indication of unintentional separation of the contacts, and in response to the obtained indication, opening the contactor and maintaining the contactor in an open position by turning off the control current.

19 Claims, 3 Drawing Sheets

(56) References Cited

U.S. PATENT DOCUMENTS

| | | | | |
|---|---|---|---|---|
| 4,816,958 | A * | 3/1989 | Belbel | H01H 33/161 |
| | | | | 361/13 |
| 6,313,636 | B1 | 11/2001 | Pohl et al. | |
| 8,638,531 | B2 | 1/2014 | Bhavaraju et al. | |
| 9,455,098 | B2 * | 9/2016 | Lunden | H01H 3/32 |

FOREIGN PATENT DOCUMENTS

| | | | | |
|---|---|---|---|---|
| EP | 0694937 | A3 | 8/1997 | |
| EP | 0864168 | A2 | 9/1998 | |
| EP | 2317527 | A1 | 5/2011 | |
| EP | 2551880 | A2 * | 1/2013 | H01H 3/48 |
| WO | 2012072810 | A1 | 6/2012 | |
| WO | 2015070893 | A1 | 5/2015 | |

OTHER PUBLICATIONS

International Search Report and Written Opinion of the International Searching Authority; Application No. PCT/EP2021/072000; Completed: Oct. 8, 2021; dated Oct. 18, 2021; 9 Pages.

Extended European Search Report; Application No. 20196398.0; Completed: Feb. 19, 2023; dated Mar. 3, 2021; 7 Pages.

* cited by examiner

CONTACTOR CONTROL

TECHNICAL FIELD

The present disclosure relates to a method of controlling a mechanical contactor.

BACKGROUND

A mechanical contactor is a switching device normally intended for performing a high number of switching operations during normal load and overload conditions. The IEC product standard defines a mechanical contactor as a mechanical switching device having only one position of rest, operated otherwise than by hand, capable of making, carrying and breaking currents under normal circuit conditions including operating overload conditions.

A traditional application is to start, run and stop electrical 3-phase AC-motors just by applying and removing voltage to the circuit. It means that the contactor shall be able to make the inrush current and carry the starting current during a limited time, it shall also be able to carry the normal current during continuous operation and finally break the current when the motor shall be stopped. In some cases, the contactor may also need to break the starting current that can be significantly higher than the normal current and therefore the breaking capacity should be high enough for these cases.

A short circuit fault is normally not handled by the contactor, but by a Short Circuit Protection Device (SCPD) like for instance fuses or circuit breakers. In case of short circuit, such devices shall clear the fault and prevent hazardous effects. A short circuit is a critical situation for a contactor since the current can be very high, even if the time period with very high current is short, the separation forces on the contacts can be high and the energy dissipated in the device can also be high. The coordination between the SCPD and the contactor can be difficult and is often an issue.

During a short circuit fault, the large current flowing through the contacts of the contactor induce Lorenz forces which may force the contacts to separate, resulting in an electric arc between the contacts. The arc itself is a plasma but on the contact surfaces there will be melted contact material when the arc is burning. This happens during a normal current breaking procedure as well as during a contact separation caused by a short circuit. However, during a normal breaking procedure, the contacts are brought completely apart, and the arc is extinguished by an extinction system, the current is broken by the contactor itself and the contacts stay in fully open position and cool down. On the other hand, in case of a short circuit, the contacts may be pressed apart unintentionally by the Lorenz forces, creating an arc with melted material on the contact surfaces. When the short circuit is cleared by the SCPD, the separation force disappears and the contacts may again be pressed together. The melted material on the surfaces may then weld together when the contacts cool down and the contactor may no longer be opened since the contacts are stuck in a shorted position. This prevents the contactor from being reused after a short circuit fault.

SUMMARY

It is an objective of the present invention to prevent the welding together of contacts of a contactor as a result of unintentional separation of the contacts.

According to an aspect of the present invention, there is provided a method of controlling a mechanical contactor comprising at least one pair of contacts for conducting a mains current when the contactor is in a closed position, and an electromagnet arranged to close the contactor, and maintain the contactor in the closed position, by forcing the pair of contacts towards each other when a control current runs through a coil of the electromagnet. The method comprises, while the contactor is in the closed position, obtaining an indication of unintentional separation of the contacts, and in response to the obtained indication, opening the contactor and maintaining the contactor in an open position by turning off the control current.

According to another aspect of the present invention, there is provided a computer program product comprising computer-executable components for causing a controller to perform an embodiment of the method of the present disclosure when the computer-executable components are run on processing circuitry comprised in the controller.

According to another aspect of the present invention, there is provided a controller for a mechanical contactor. The controller comprises processing circuitry, and storage storing instructions executable by said processing circuitry whereby said controller is operative to, while the contactor is in the closed position, obtain an indication of unintentional separation of contacts of a pair of contacts of the contactor, for conducting a mains current when the contactor is in the closed position, and to, in response to the obtained indication, open the contactor and maintaining the contactor in an open position by turning off a control current in a coil of an electromagnet arranged to close the contactor, and maintain the contactor in the closed position, by forcing the pair of contacts towards each other when the control current runs through said coil.

According to another aspect of the present invention, there is provided a mechanical contactor comprising an embodiment of the controller of the present disclosure, the pair of contacts for conducting the mains current when the contactor is in the closed position, and the electromagnet arranged to close the contactor and maintain the contactor in the closed position by forcing the pair of contacts towards each other when the control current runs through the coil of the electromagnet.

By opening the contactor, including actively separating the contacts and preventing them from reclosing, welding together of the contacts is prevented by allowing them to cool down sufficiently following any arcing there between.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Figure 1:
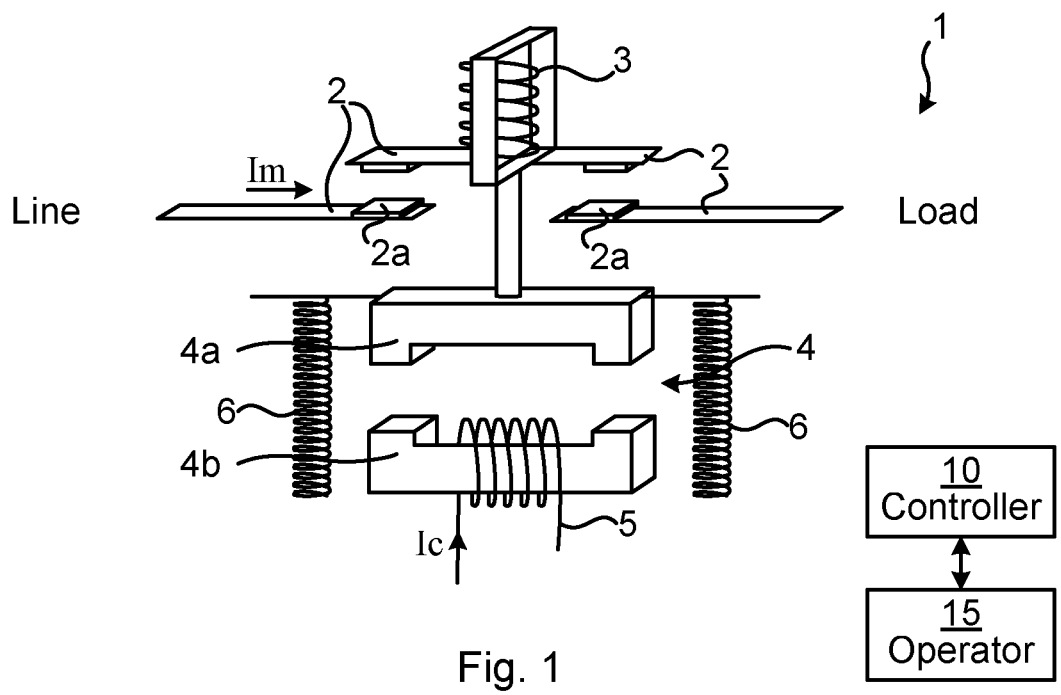
FIG. 1 is a schematic perspective view of a contactor in accordance with some embodiments of the present invention.

FIG. 1 illustrates a contactor 1 arranged to make, carry and break a main current Im, e.g. between a line and a load. The contactor comprises at least one pair of contacts 2, which make the main current Im when brought in contact with each other (closing the contactor, i.e. bringing the contactor from an open position to a closed position), carry the main current when maintained in contact with each other (maintaining the contactor in the closed position), and breaking the main current when separated from each other (opening the contactor, i.e. bringing it from the closed position to the open position). In the embodiment of FIG. 1, the contactor comprises two contact pairs in series, each contact 2 having a contact surface 2a for making contact with the other contact 2 of its pair.

FIG. 1 illustrates a single-phase contactor 1. However, a corresponding contactor may be designed for any number of phases, e.g. with one or two contact pairs per phase. In case of a three-phase contactor, two contact pairs in series (as in FIG. 1) may be arranged for each phase, for a total of six contact pairs, typically all of which are operated by a single electromagnet 4.

For operation, the contactor 1 comprises an electromagnet 4 functioning as an actuator for closing the contactor, maintaining the contactor in the closed position and opening the contactor, respectively. The electromagnet 4 comprises a movable armature 4a and a stationary core 4b, around which core 4b a coil 5 is wound and arranged to carry a control current Ic. When no control current Ic is flowing through the coil 5, there is no magnetic attraction between the core 4b and the armature 4a, why the armature is held away from the core by means of the separation spring(s) 6 and the contacts 2 are held separated from each other, i.e. the contactor is in its open position. When the control current Ic is turned on and thus flowing through the coil 5, the coil and thus the electromagnet 4 is magnetized whereby the armature 4a is pulled magnetically towards the core 4b, bringing the contact pairs in contact with each other and thus bringing the contactor from its open position to its closed position. While the control current Ic is flowing, the contactor remains in the closed position. Optionally, a contact spring 3 is used to evenly press the contacts 2 against each other while the contactor in the closed position. When the control current Ic is turned off, i.e. not flowing through the coil 5, the coil 5 (and thus the electromagnet 4) is demagnetized, the armature 4a is pushed away from the core 4b by means of the separation spring 6 and/or the contact spring 3, the contacts 2 are separated and the contactor is thus brought from its closed position to its open position.

In case of a fault, typically a short circuit fault, when the mains current Im is increased, the contacts 2 of a contact pair may be forced away from each other by so called Lorenz forces, possibly separating the contacts and allowing an arc to form therebetween while the contactor is in its closed position. If the contactor remains in its closed position by the control current Ic flowing through the coil 5, the contacts 2 of the pair may then be forced together again after the fault current is over, by the armature 4a and/or the contact spring 3. If an arc has melted the contact surfaces 2a of the contacts 2 during the fault, the contacts may then be welded together when forced into contact again, making the contactor unusable and in need of service or replacing.

The contactor also comprises a controller 10, arranged to control the control current Ic, including turning the control current on and off as desired, by means of control signals. The controller 10 may also interact with an operator 15 of the contactor, e.g. a human operator and/or an operating system. The controller may e.g., provide information about the operation of the contactor to the operator, e.g. to a human operator via a user interface such as a display screen and/or light and/or sound indicators. Such information may be regarding faults or fault induced opening of the contactor.

Figure 2:
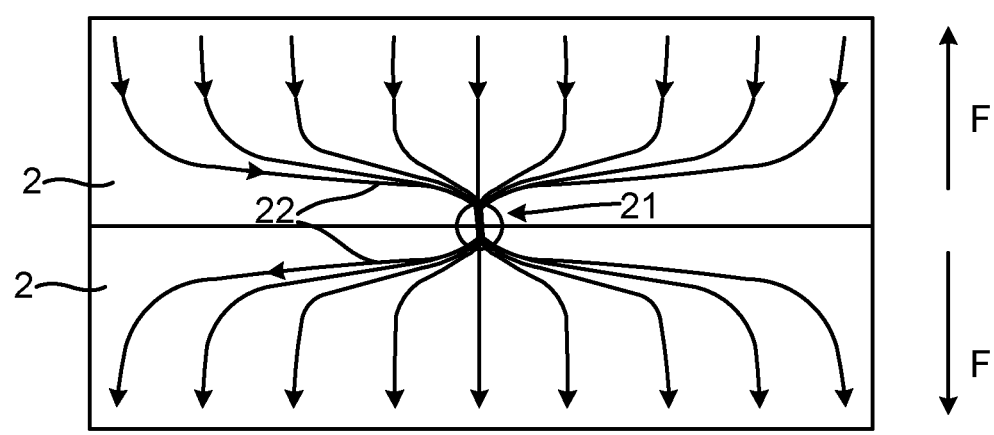
FIG. 2 is an illustration of current paths via A-spots and corresponding Lorenz forces between contacts, in accordance with some embodiments of the present invention.

FIG. 2 illustrates current paths over an interface between two contacts 2 of a contact pair when the contactor 1 is in its closed position. It has been found that electric contact is made in very small points called A-spots 21. When two flat contact surfaces 2a come together the contact is not made over the whole surface but in these specific A-spots 21, the current passing between the contacts 2 has to pass through the A-spots and the current will be constricted in these points. The constriction of current results in antiparallel current paths 22 and Lorenz forces between these paths 22 will create separation forces F on the two contacts 2. When the current increases, the separation forces F will also increase and there is approximately a square relation between separation force and current, $F \sim I^2$. In normal situations and overload situations, the contact spring 3 and electromagnet 4 must be strong enough to counteract the separation forces, but during e.g. a short circuit fault the separation forces may become so high that the contacts are separated and, in some cases, even the electromagnet 4 may be forced opened. During such a fault it may be not only the Lorenz forces that effect the contacts 2 but also the pressure built up by the high energy consumption.

When the contacts 2 are separated, and a current Im is flowing, an electric arc will be ignited. The arc in itself is a plasma but on the surfaces 2a, there will be melted contact material when the arc is burning. This typically happens during a normal current breaking procedure as well as during a contact separation caused by a fault current. However, during a normal breaking procedure, the contacts 2 are brought completely apart, and the arc may be extinguished by an extinction system, the current is broken by the contactor 1 itself and the contacts 2 stay fully separated from each other when they cool down.

In contrast, in case of a fault current, the contacts 2 may be pressed apart unintentionally, creating an arc with melted material on the surfaces 2a, and when the fault is cleared, e.g. by the SCPD, the separation force F will be reduced allowing the contacts 2 to be pressed together again. The melted material on the surfaces 2a may then weld together when the contacts 2 cool down and the contactor 1 can no longer be opened since the contacts 2 are stuck in a shorted position.

For a conventional contactor, the control of a contactor 1 is just an on/off signal. The contactor is neither an overload detection device nor an SCPD, it just switches the main current Im on and off. The normal behaviour for a contactor 1 is therefore to close or stay closed when the on signal (e.g. from an operator system 15) is activated. Therefore, the contactor will normally reclose the contacts 2 after an unintentional separation of contacts caused by a fault current. This can be avoided by means of embodiments of the present invention.

In accordance with the present invention, the controller 10 acts to open the contactor 1, by turning off the control current Ic, upon obtaining an indication of unintentional separation of the contacts 2 of a contact pair, thus avoiding welding together of the contacts. After allowing time in open position for the contacts to cool down, the contactor may be reset, again allowing the contactor to be closed when an on signal is received by the controller 10. The obtained indication may indicate actual separation of the contacts 2, and/or a formed arc there between, or indicate an elevated risk of such separation or arc.

Figure 3:
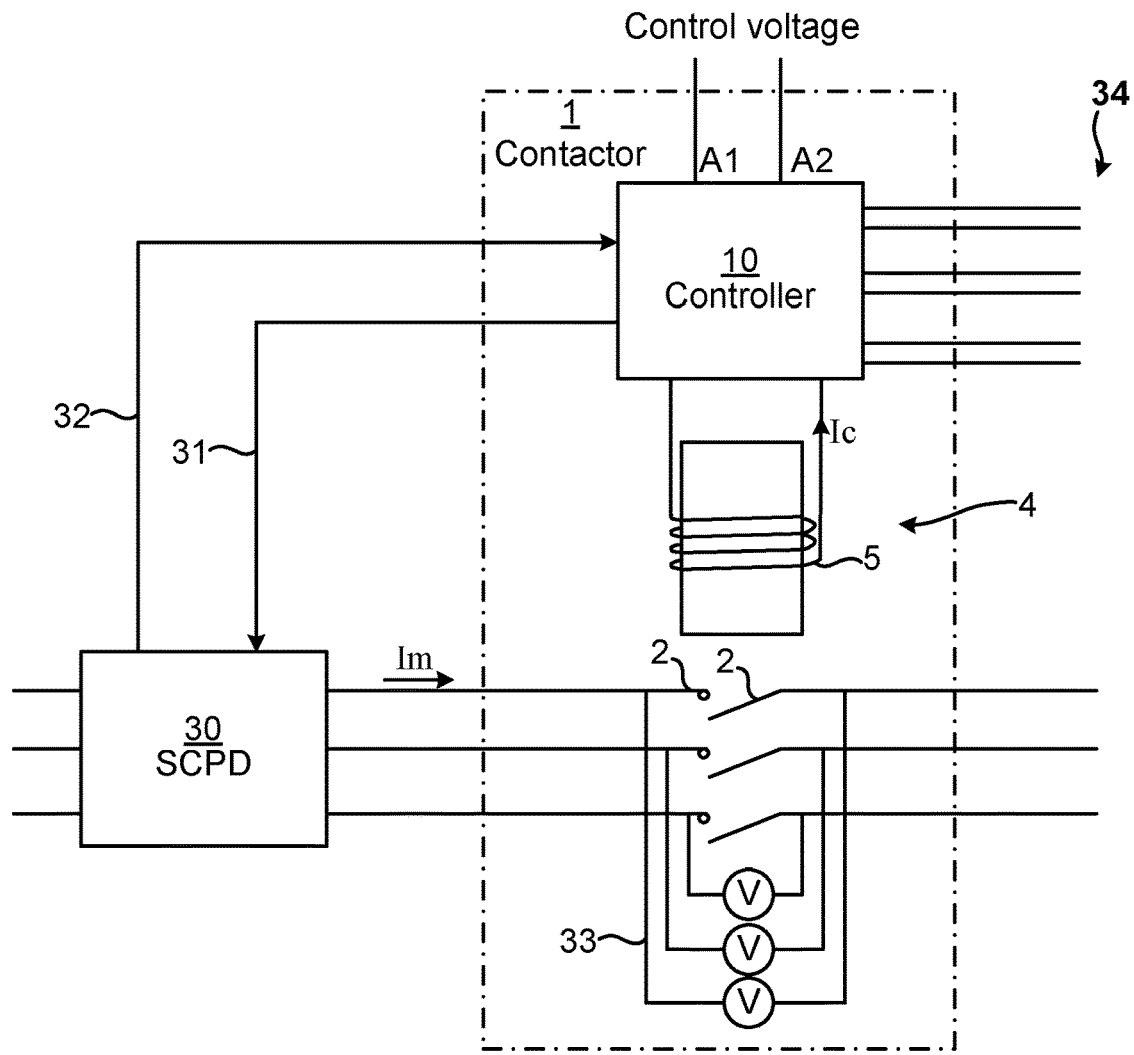
FIG. 3 is a schematic circuit diagram of a contactor and an associated Short-Circuit Protection Device (SCPD), in accordance with some embodiments of the present invention.

FIG. 3 illustrates a contactor 1 and its relation to its surroundings. In the embodiment of FIG. 3, the main current Im is a three-phase current controlled by the contactor 1 having pairs of contacts 2 for each phase, the opening and closing of which are controlled by the controller 10 via the control current Ic as discussed in relation to FIG. 1.

As schematically illustrated in FIG. 3, the controller 10 may receive control voltage via terminals A1 and A2. The controller 10 may also interact with the outside of the contactor 1 (e.g. the operator 15) via any input and output signals 34 such as serial or digital on/off input signals, serial, digital or visual status output(s), and/or serial, digital or manual reset input signal.

An SCPD 30 is arranged to break the main current Im upon detection of a fault current, i.e. detecting that the main current increases above a predetermined threshold. In some embodiments of the present invention, the SCPD may cooperate with the contactor 1. For instance, if the SCPD detects a fault current, it may send an open contactor signal 32 to the controller 10, inducing the controller to turn off the control current Ic, bringing the contactor from its closed position to its open position. Conversely, if the controller 10 opens the contactor 1 in response to an indication of unintentional separation of the contacts 2, the controller 10 may also send a trip signal 31 to the SCPD, inducing the SCPD to break the main current Im. In both cases, the main current Im may be broken by both the contactor 1 and the SCPD 30.

Thus, one way of detecting a possible unintentional contact separation is to measure the main current Im, and in case of a high current, typically above a predetermined threshold, there is a high probability of contact separation. Therefore, a measurement of a high current may provide an indication that the controller 10 should open the contactor and prevent it from reclosing. Current measurement is often included in an SCPD 30, and in addition to the SCPD itself breaking the current Im it may send a signal 32 to the contactor 1 so that it also opens.

Another way of detecting a possible unintentional contact separation is by measuring the voltage V across the contacts 2, by means of a voltage measuring circuit 33. An increased voltage over a contact pair is indicative of separation and an arc burning between them. If the contacts 2 are in contact with each other, the voltage V will be very low, typically <<1 V, and be proportional to the impedance and current Im in the circuit (the impedance of a closed contact is normally very low). When an arc is ignited, the voltage V will immediately step up, e.g. to a magnitude of about 10 V on each contact pair. For short distances, the voltage V is mainly defined by the anode and cathode of the arc. For two contact pairs in series as in FIG. 1, if arcs are burning on both contact pairs, the voltage V will step up doubly, e.g. to a magnitude of about 20 V. This measured increased voltage will be created immediately when the contacts 2 are separated even if the distance between them is only parts of a millimetre. If the distance between the contacts 2 is further increased, the arc is stretched out and the voltage V will increase further.

To avoid reclosing of a contact pair after unintentional separation of the contacts 2 thereof, it is desirable to be able to quickly open the contactor by demagnetizing the coil 5. However, when the controller 10 turns off the control current Ic, typically by removing a voltage source therefore, the control current Ic decays during a period of time before the energy stored in the coil 5 is completely consumed. Thus, in order to further reduce the risk of welding together of contacts 2 following unintentional separation thereof, it may be desirable to shorten the time period for demagnetization of the coil.

Figure 4:
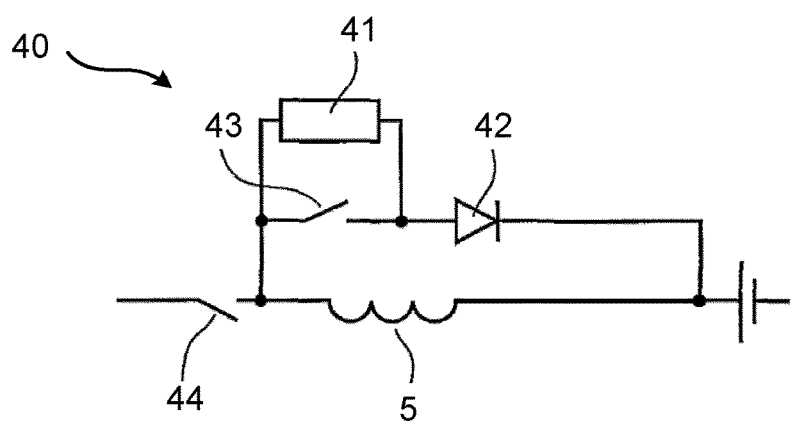
FIG. 4 is a schematic circuit diagram of a demagnetizing circuit across the coil of the electromagnet of the contactor, in accordance with some embodiments of the present invention.

FIG. 4 illustrates an example of a demagnetization circuit 40 connected across the coil 5 and in series with a one-way current conducting device 42. The demagnetization circuit comprises an impedance 41, e.g. comprising a resistance, a zener diode and/or any other element able to consume energy when a current flows through it. When turning off the control current Ic, e.g. by opening switch 44, and it's desired to quickly decrease the control current Ic, switch 43 may also be opened, connecting the impedance 41 across the coil 5. The one-way current conducting device 42 is typically connected anti-parallel to the coil 5, and may comprise a diode such as a freewheeling diode, for preventing transients and maintain an even current in the coil 5.

FIGS. 5a-d illustrate different embodiments of the method of controlling the mechanical contactor 1, of the present invention.

Figure 5A:
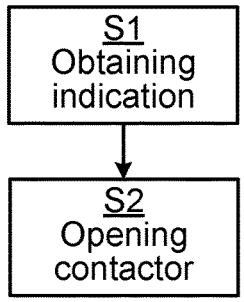
FIGS. 5a, 5b, 5c and 5d are schematic flow charts of different embodiments of a method of the present invention.

According to the embodiments of FIG. 5a, an indication of unintentional separation of the pair of contacts 2 is obtained S1 while the contactor is in the closed position. Then, in response to the obtained S1 indication, the contactor is opened S2 and the contactor is maintained in its open position by turning off the control current Ic.

Figure 5B:
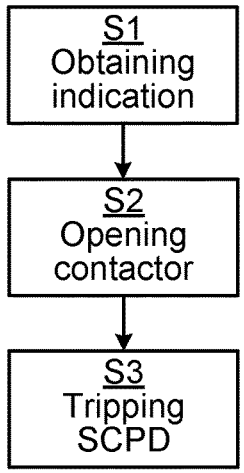
Figure 5C:
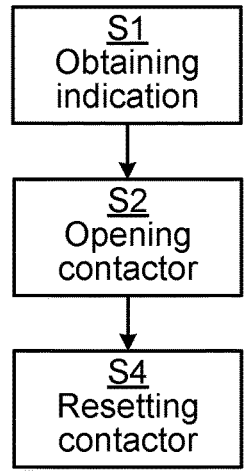
Figure 5D:
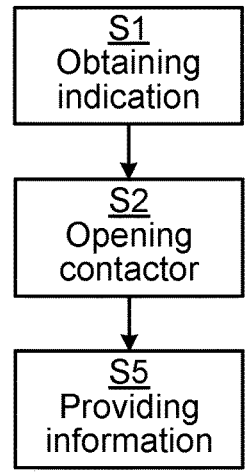

According to the embodiment of FIG. 5b, which may be combined with any of the embodiments of FIGS. 5a, 5c, and 5d, a short circuit protection device (SCPD) 30 is tripped S3, before, after or concurrently with the opening S2 of the contactor, to break the mains current Im outside of the contactor 1.

According to the embodiment of FIG. 5c, which may be combined with any of the embodiments of FIGS. 5a, 5b, and 5d, the contactor 1 is reset S4, after the opening S2 of the contactor, allowing the contactor to be reclosed by turning on the control current Ic. In some embodiments, the opening S2 of the contactor results in the contactor being maintained in its open position until the operator 15, be it a human operator or an operating system, actively resets S4 the contactor, e.g. after a predetermined time has elapsed from the opening S2, to allow the contacts 2 to cool down, or after inspecting (e.g. measuring the temperature thereof) the contacts 2 or other parts of the contactor, to ensure that it is safe to reset S4 the contactor to normal operation.

According to the embodiment of FIG. 5d, which may be combined with any of the embodiments of FIGS. 5a, 5b, and 5c, information is provided S5, after the opening S2, to an operator 15 of the contactor 1, e.g. a human operator or an operating system, about the opening S2. This information may e.g. be used by the operator 15 to determine when to reset S4 the contactor, or whether the contactor is in need of service. The information may be provided S5 e.g. comprising an alarm signal to an operating system operator 15 and/or via a user interface, such as comprising a display screen and/or light and/or sound indicators, to a human operator 15.

In some embodiments of the present invention, the obtaining S1 of an indication comprises detecting an increased voltage V over the contact pair, e.g. by means of a voltage measuring circuit 33. In some embodiments, the increased voltage is at least 1 V, e.g. at least 10 V.

In some embodiments of the present invention, the obtaining S1 of an indication comprises detecting an increased mains current Im, e.g. by means of the SCPD 30.

In some embodiments of the present invention, the electromagnet 4 comprises a demagnetization circuit 40 connected across the coil 5. In some embodiments, the demagnetization circuit 40 comprises an impedance 41. In some embodiments, a freewheeling diode 42 is arranged in series with the demagnetization circuit 40, which diode 42 is arranged anti-parallel to the control current Ic.

In some embodiments of the present invention, the at least one pair of contacts 2 comprises two contact pairs in series which each other.

In some embodiments of the present invention, the mains current Im is a three-phase current and the at least one pair of contacts 2 comprises a respective contact pair per phase of the three-phase current.

Figure 6:
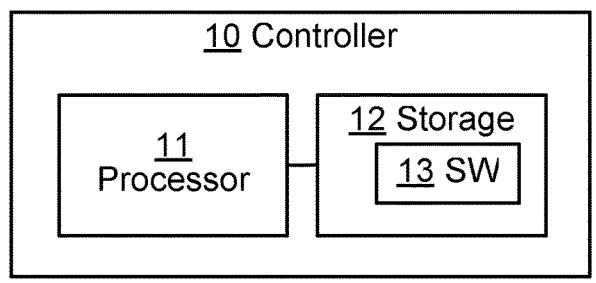
FIG. 6 is a schematic block diagram of a controller, in accordance with some embodiments of the present invention.

FIG. 6 schematically illustrates an embodiment of the controller 10 of the present disclosure. The controller 10 comprises processing circuitry 11 e.g. a central processing unit (CPU). The processing circuitry 11 may comprise one or a plurality of processing units in the form of microprocessor(s). However, other suitable devices with computing capabilities could be comprised in the processing circuitry 11, e.g. an application specific integrated circuit (ASIC), a field programmable gate array (FPGA) or a complex programmable logic device (CPLD). The processing circuitry 11 is configured to run one or several computer program(s) or software (SVV) 13 stored in a data storage 12 of one or several storage unit(s) e.g. a memory. The storage unit is regarded as a computer readable means 12, forming a computer program product together with the SW 13 stored thereon as computer-executable components, as discussed herein and may e.g. be in the form of a Random Access Memory (RAM), a Flash memory or other solid state memory, or a hard disk, or be a combination thereof. The processing circuitry 11 may also be configured to store data in the storage 12, as needed.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method of controlling a mechanical contactor having:
at least one pair of contacts for conducting a mains current when the contactor is in a closed position; and
an electromagnet arranged to close the contactor, and maintain the contactor in the closed position, by forcing the pair of contacts towards each other when a control current (Ic) runs through a coil of the electromagnet;
wherein, when no control current (Ic) is flowing through the coil the contactor is in its open position;
wherein, when the control current (Ic) is turned on and thus flowing through the coil, the contactor is brought from its open position to its closed position; and
while the control current (Ic) is flowing through the coil, the contactor remains in the closed position;
the method comprising:
while the control is flowing through the coil (Ic), obtaining an indication of unintentional separation of the contacts of the pair; and
in response to the obtained indication, turning off the control current (Ic), thereby avoiding reclosing of the pair of contacts after the unintentional separation.

2. The method of claim 1, wherein the obtaining an indication includes detecting an increased voltage over the contact pair.

3. The method of claim 2, wherein the increased voltage is at least 1 V, e.g. at least 10 V.

4. The method of claim 2, wherein the obtaining an indication includes detecting an increased mains current (Im), e.g., by means of a short circuit protection device, SCPD.

5. The method of claim 2, further comprising:
tripping a short circuit protection device, SCPD, to break the mains current (Im) outside of the contactor.

6. The method of claim 2, further comprising:
resetting the contactor by turning on the control current (Ic).

7. The method of claim 2, further comprising:
providing information to an operator of the contactor, e.g., a human operator or an operating system, about the turning off of the control current (Ic).

8. The method of claim 1, wherein the obtaining an indication includes detecting an increased mains current (Im), e.g., by means of a short circuit protection device, SCPD.

9. The method of claim 1, further comprising:
tripping a short circuit protection device, SCPD, to break the mains current (Im) outside of the contactor.

10. The method of claim 1, further comprising:
resetting the contactor by turning on the control current (Ic).

11. The method of claim 1, further comprising:
providing information to an operator of the contactor, e.g., a human operator or an operating system, about the turning off of the control current (Ic).

12. The method of claim 1, wherein the electromagnet comprises a demagnetization circuit connected across the coil.

13. The method of claim 12, wherein the demagnetization circuit comprises an impedance.

14. The method of claim 13, wherein a freewheeling diode is arranged in series with the demagnetization circuit, which diode is arranged anti-parallel to the control current (Ic).

15. The method of claim 1, wherein the at least one pair of contacts includes two contact pairs in series which each other.

16. The method of claim 1, wherein the mains current (Im) is a three-phase current and the at least one pair of contacts includes a respective contact pair per phase of the three-phase current.

17. A computer program product comprising computer-executable components for causing a controller to perform a method of controlling a mechanical contractor having at least one pair of contacts for conducting a mains current (Im) when the contactor is in a closed position, and an electromagnet arranged to close the contractor, and maintain the contractor in the closed position, by forcing the pair of contacts towards each other when a control current (Ic) runs through a coil of the electromagnet;
  wherein when no control current (Ic) is flowing through the coil, the contactor is in its open position;
  wherein when the control current (Ic) is turned on and thus flowing through the coil, the contactor is brought from its open position to its closed position; and
  while the control current (Ic) is flowing through the coil, the contactor remains in the closed position;
  the method comprising:
    while the control current (Ic) is flowing through the coil, obtaining an indication of unintentional separation of contacts of the pair; and
    in response to the obtained indication, turning off the control current (Ic), thereby avoiding reclosing of the contacts after the unintentional separation.

18. A controller for a mechanical contactor, the controller comprising:
  processing circuitry; and
  storage storing instructions executable by said processing circuitry whereby said controller is operative to preform a method of controlling a mechanical contractor having at least one pair of contacts for conducting a mains current (Im) when the contactor is in a closed position, and an electromagnet arranged to close the contractor, and maintain the contractor in the closed position, by forcing the pair of contacts towards each other when a control current (Ic) runs through a coil of the electromagnet;
  wherein when no control current (Ic) is flowing through the coil, the contactor is in its open position;
  wherein when the control current (Ic) is turned on and thus flowing through the coil, the contactor is brought from its open position to its closed position; and
  while the control current (Ic) is flowing through the coil, the contactor remains in the closed position;
  the method comprising:
    while the control current (Ic) is flowing through the coil, obtaining an indication of unintentional separation of contacts of the pair; and
    in response to the obtained indication, turning off the control current (Ic), thereby avoiding reclosing of the contacts after the unintentional separation.

19. A mechanical contactor comprising:
  a controller;
  a pair of contacts for conducting a mains current (Im) when the contactor is in a closed position; and
  an electromagnet arranged to close the contactor, and maintain the contactor in the closed position, by forcing the pair of contacts towards each other when a control current (Ic) runs through a coil of the electromagnet;
  wherein the controller includes processing circuitry and storage storing instructions executable by said processing circuity whereby said controller is operative to perform a method of controlling the mechanical contractor;
  wherein when no control current (Ic) is flowing through the coil, the contactor is in its open position;
  wherein when the control current (Ic) is turned on and thus flowing through the coil, the contactor is brought from its open position to its closed position; and
  while the control current (Ic) is flowing through the coil, the contactor remains in the closed position;
  the method comprising:
    while the control current (Ic) is flowing through the coil, obtaining an indication of unintentional separation of the contacts of the pair; and
    in response to the obtained indication, turning off the control current (Ic), thereby avoiding reclosing of the pair of contacts after the unintentional separation.

* * * * *